United States Patent [19]

Binder et al.

[11] 4,070,626

[45] Jan. 24, 1978

[54] RADIO TELEPHONE WITH CHANNEL SWITCH

[75] Inventors: Anton Binder; Manfred Franke; Siegfried Gärtner, all of Berlin, Germany

[73] Assignee: Robert Bosch GmbH, Stuttgart, Germany

[21] Appl. No.: 772,293

[22] Filed: Feb. 25, 1977

[30] Foreign Application Priority Data

Feb. 27, 1976 Germany .............................. 2607992

[51] Int. Cl.² .............................................. H04B 1/54
[52] U.S. Cl. ........................................ 325/17; 325/25; 325/421
[58] Field of Search .................... 325/17, 25, 432, 464, 325/465, 470, 471, 421, 422, 423; 343/175, 179, 181; 331/1 R, 1 A, 18, 25

[56] References Cited

U.S. PATENT DOCUMENTS 3,696,422  10/1972  Burrell ................................... 325/17
4,027,242  5/1977  Yamanaka .............................. 325/25

Primary Examiner—Benedict V. Safourek
Attorney, Agent, or Firm—Spencer & Kaye

[57] ABSTRACT

In a radio telephone device including a channel selector containing at least one frequency divider having a plurality of control inputs each associated with a respective frequency dividing ratio and each arranged to receive an electrical signal for influencing its frequency dividing ratio, the channel selector is further constituted by a single pole, multi-position switch manually actuable to supply a fixed reference potential to any selected one of a plurality of fixed contacts, and a matrix circuit having a plurality of inputs connected to the fixed contacts, a plurality of outputs connected to the frequency divider control inputs, and interconnection elements connecting the matrix circuit inputs to the outputs thereof and being constructed to be acted on from outside the matrix to establish a particular interconnection pattern between the matrix inputs and outputs before the device is first placed into use.

15 Claims, 2 Drawing Figures

RADIO TELEPHONE WITH CHANNEL SWITCH

BACKGROUND OF THE INVENTION

The present invention relates to a radio telephone with a channel switch for tuning the radio telephone to one of a certain number of particular radio channels selected from a larger number of available radio channels.

In such radio telephones, which are exemplified by citizens band radios, each channel is associated with its own discrete oscillator frequency which is furnished by a phase locked loop (PLL) oscillator circuit containing a frequency divider having a dividing ratio which can be digitally switched by means of the channel switch.

Multichannel radio telephones must be able to be switched to any one of a number of different radio channels which are arranged according to a frequency pattern. Since only very narrow frequency tolerances are permissible for the individual channel frequencies, the frequency determining elements of the oscillator circuits can only be quartz crystals.

For example, there are units in which one quartz crystal is provided for each radio channel and in which the quartz crystal associated with the desired radio channel can then be switched on by means of a single pole channel switch. It might be noted, in this connection, that there exist radio telephone networks employing, for example, radio telephone units having a ten to twenty channel capacity in which a large region is divided into spatially limited areas and each area has assigned to it a different series of radio channels. These radio telephone units must thus be equipped with different sets of quartz crystals, the set selected depending on the area in which they are to be employed.

In order to avoid the necessity for having available a quartz crystal for every one of the possible frequencies, and instead to be able to use one quartz crystal as a reference standard, oscillations at the frequencies associated with a plurality of channels in a multichannel radio telephone can be generated by means of a multichannel oscillator employing digital frequency division. Such an oscillator in part of a PLL oscillator circuit and includes an oscillator which is controllable by means of an electrical voltage, a frequency divider producing a dividing ratio which can be digitally set by means of the channel switch of the radio telephone and a phase comparison circuit. While a first input of the phase comparison circuit receives a reference frequency signal which is derived from the quartz crystal, the second input receives a signal represented by the oscillator output reduced in frequency by means of the frequency divider. At one output, the phase comparison circuit emits a voltage whose value depends on the phase difference between the two frequencies and which serves to regulate the oscillator.

Since the frequency divider must be digitally controllable, the channel switch of the radio telephone may be designed, for example, as a coding switch, as disclosed in German Offenlegungsschrift [Laid-Open Application] No. 23 04 772. Before the radio telephone is used for the first time, such a coding switch must then be coded for the intended series of radio channels, i.e., it has to be manually set to a certain switching combination for each channel. Such a channel switch has a relatively complicated structure and programming of the switch is a time consuming operation.

For multichannel radio telephones with, for example, 120 different radio channels, it has been proposed to employ two BCD coding switches in conjunction with a recoder.

SUMMARY OF THE INVENTION

It is an object of the present invention to simplify the circuitry needed to actuate the frequency divider of the PLL oscillator circuit of such a radio telephone.

This and other objects according to the invention are accomplished, in a radio telephone unit including a channel switch for tuning the instrument to one radio channel of a certain number of given radio channels, where each radio channel has associated with it a discrete oscillator frequency, the unit further including a phase locked loop oscillator circuit containing a signal controllable frequency divider assembly having a plurality of control inputs and arranged to have a dividing ratio determined by the control inputs to which signals are being complied, the oscillator circuit producing oscillations at the discrete oscillator frequency of any selected channel, by constituting the channel switch by a single pole switch having a plurality of fixed contacts and a movable contact disposed for connecting any one of the fixed contacts to a source of a fixed reference potential, and by further providing the unit with a matrix circuit having a plurality of inputs each connected to a respective fixed contact of the switch, a plurality of outputs each connected to a respective control input of the frequency divider member, and interconnection elements disposed between the inputs and outputs and permanently programmed before the first use of the unit for causing a respectively different signal pattern to appear at the outputs of the matrix circuit in response to each switching position of the channel switch. Units according to the invention are primarily intended for use in systems in which the number of given radio channels is assigned to a unit from a larger number of available radio channels.

In the practice of the invention, use can be made of a commercially available, unipolar channel switch and a matrix circuit, for example a diode matrix circuit, which can be programmed very easily.

DESCRIPTION OF THE PREFERRED EMBODIMENTS

Figure 1:
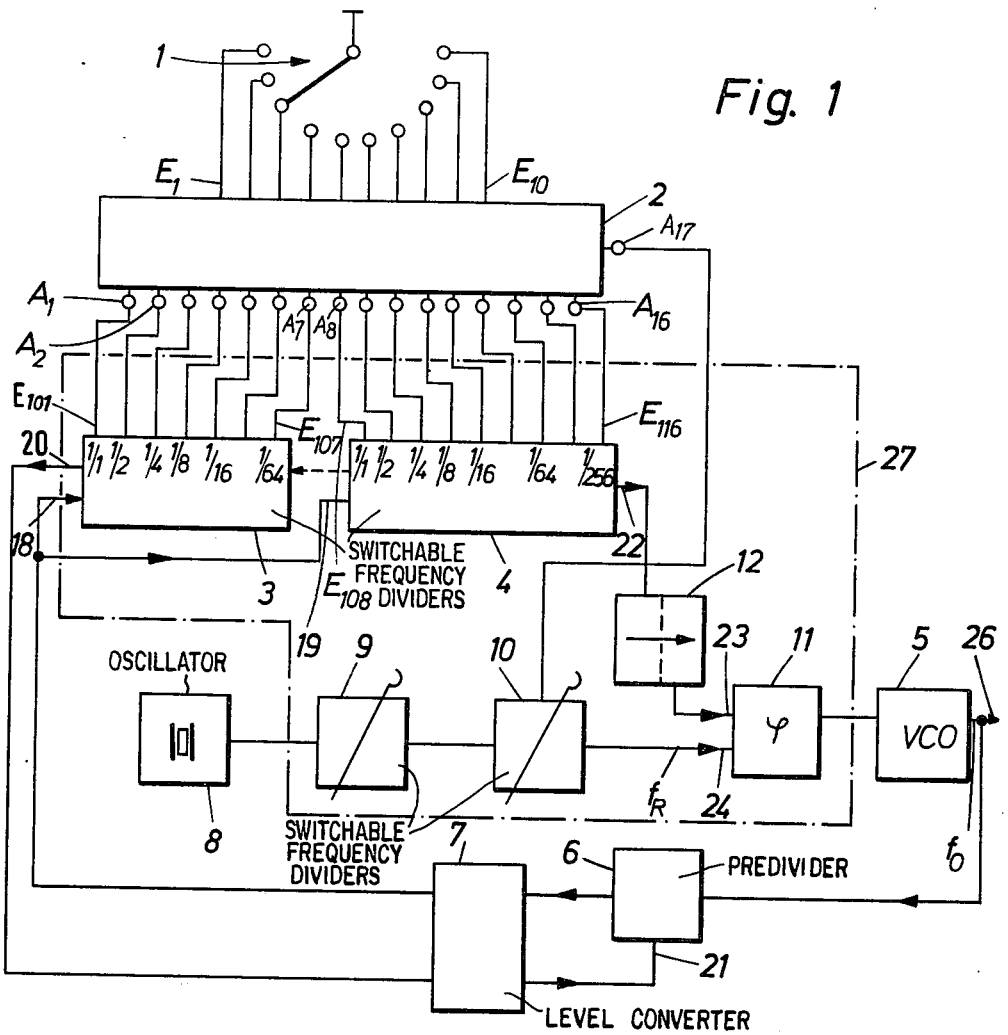
FIG. 1 is a block circuit diagram of a preferred embodiment of a device according to the invention for generating channel tuning frequency signals in a radio telephone.

The device shown in FIG. 1 is provided with a single pole channel switch 1 having 10 switching positions which correspond to ten radio channels. While the movable contact of the channel switch is connected to a source of a fixed reference potential, for example ground potential, each of its fixed contacts is connected to a respective one of 10 inputs $E_1 \ldots E_{10}$ of a matrix circuit 2 which in the illustrated embodiment has seventeen outputs $A_1, A_2 \ldots A_7, A_8 \ldots A_{16}, A_{17}$. Each one of outputs $A_1 \ldots A_7$ is connected to a respective input $E_{101} \ldots E_{107}$ of a first frequency divider 3 and each one of outputs $A_8 \ldots A_{16}$ is connected to a respective input $E_{108} \ldots E_{116}$ of a second frequency divider 4.

The two frequency dividers 3 and 4 are connected in a PLL oscillator circuit which includes an oscillator 5 producing an output oscillation at a frequency $f_0$ which is controllable by means of an electrical voltage, a frequency predivider 6, a level converter 7, a quartz controlled reference frequency oscillator generator 8, two frequency dividers 9 and 10 associated with the reference frequency oscillation generator, a phase comparison circuit 11 and a monostable multivibrator circuit 12.

The above-described components cooperate as follows. The matrix circuit 2, which preferably is a diode matrix circuit or a programmable nonerasable memory (PROM memory), is programmed in a certain manner before the radio telephone is used for the first time.

Figure 2:
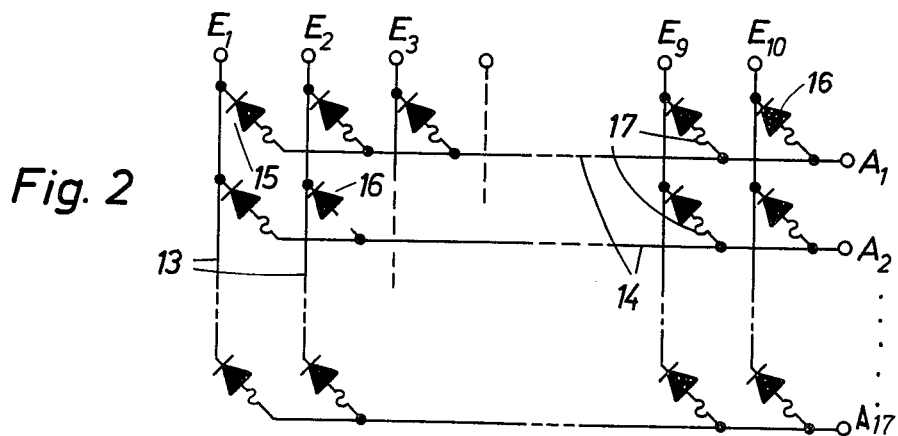
FIG. 2 is a basic circuit diagram for a diode matrix circuit constituting a preferred embodiment of the matrix circuit employed in the device of FIG. 1.

In the embodiment constituted by a diode matrix circuit as shown in FIG. 2, inputs $E_1, E_2, E_3 \ldots E_9, E_{10}$ are connected to column conductors 13 and outputs $A_1$, $A_2 \ldots A_{17}$ are connected to row conductors 14. The meaning of $A_{17}$ will be disclosed below.

At the cross-over points between the column and row conductors 13 and 14, they are electrically connected together via respective diodes 15, 16 provided to decouple the output lines from one another and to decouple the input lines from one another. A severable conductor, which may be, for example, a fuse 17 that can be melted by an electrical current, is connected in series with each diode.

While, in the original state of the matrix circuit, each input, for example $E_1$, is electrically connected with all outputs $A_1 \ldots A_{16}$, certain of the conductors in series with each diode may be interrupted so as to program the matrix circuit. If, for example, the line connection between the input $E_2$ and the output $A_2$ is to be severed, there can be applied across the connection a voltage having a magnitude and polarity selected to produce a melting current through the meltable fuse and the diode 16, causing the associated fuse 17 to melt. After the matrix circuit has thus been completely programmed, the circuit will emit a different predetermined combination of digital signals to the first and second frequency dividers 3 and 4 at each switching position of channel switch 1.

Upon application of a certain voltage, in this case ground potential, to one of the inputs $E_{101} \ldots E_{107}$, the first frequency divider 3 will be switched to one of the dividing ratios 1/1, 1/2, 1/4, 1/8, 1/16, 1/32 and 1/64. Correspondingly, the same applies for the second frequency divider 4, whose inputs $E_{108} \ldots E_{116}$, are each associated with a respective one of the dividing ratios 1/1, 1/2, 1/4, 1/16, 1/32, 1/64, 1/128 and 1/256. With frequency dividers 3 and 4 it is also possible to realize other whole number dividing ratios if two or more inputs are actuated simultaneously by the certain voltage. If, for example, inputs $E_{102}$ and $E_{103}$ receive that voltage, the resulting dividing ratio is 1/6.

Each of frequency dividers 3 and 4 could be constituted, for example, by a multistage binary counter which can have its desired final count state set by the signal values at its inputs $E_{101} \ldots E_{107}$ or $E_{108} \ldots E_{116}$, respectively.

Since the frequency dividers 3 and 4 can be switched only to whole number dividing ratios, a known frequency predivider is utilized to provide, selectively, a first dividing ratio of 1/101 or a second dividing ratio of 1/100.

The frequency of the output oscillation furnished by oscillator 5 is initially divided by a factor of 101 in frequency predivider 6 and is fed to a clock pulse input 18 of the first frequency divider 3 and a clock pulse input 19 of the second frequency divider 4. It is assumed that the dividing ratio set for frequency divider 4 is always greater than the dividing ratio of the first frequency divider 3. The first frequency divider 3 emits a certain signal to one input 21 of frequency predivider 6 after a number of oscillations corresponding to the set dividing ratio have appeared at the predivider output.

The certain signal effects switching of the frequency predivider 6, so that, instead of effecting a frequency predivision at a ratio of 1:101, it is effected at a ratio of 1:100. Simultaneously with emitting the certain signal to the input 21 the first frequency divider 3 is stopped by an internal logical combination. When the second frequency divider 4 has received from predivider 6 a number of oscillations equal to the dividing ratio of divider 4, the oscillations from predivider 6 being at 1/100 the frequency of the output from oscillator 5, divider 4 emits an output pulse at its output 22.

At the same time that it emits an output pulse at output 22, the second frequency divider 4 furnishes a pulse through the line shown in dashed lines in FIG. 1 to start the previously stopped first frequency divider 3 and to reset output 20 to remove the certain output signal previously present thereat. Then the above-described dividing process is repeated.

Since the moment of switching of frequency predivider 6 depends on the dividing ratio set in the first frequency divider 3, dividing ratios other than the whole number dividing ratios of frequency dividers 3 and 4 can be realized.

The output pulses appearing at the output 22 of the second frequency divider 4 are brought into a certain form by means of the monostable multivibrator circuit 12 whose output is connected to a first input 23 of phase comparison circuit 11. At a second input 24 of phase comparison circuit 11 there appears an oscillation at a reference frequency $f_R$ which has been furnished by the reference frequency generator 8 and has been divided by means of the third and fourth frequency dividers 9 and 10.

While the reference frequency generator 8 emits, for example, a quartz stabilized oscillation at a frequency of 6.4 MHz, the third frequency divider 9, which is preferably designed as an asynchronous divider, can be switched in its dividing ratio so that it is able to emit oscillations at one of the frequencies of 25, 50, 100 or 200 kHz at its output. The set frequency depends on the type of radio telephone instrument employed.

By means of a further frequency division in the fourth frequency divider 10, which is preferably a synchronous divider, the above-mentioned frequencies can be divided so that oscillation frequencies of 20 or 25 kHz; 10 or 12.5 kHz; 5 or 6.25 kHz; or 2.5 or 3.125 kHz are emitted at the output of this frequency divider. The last mentioned frequencies correspond to the respectively desired frequency pattern of the radio channels. They are produced by switching the dividing ratio of frequency divider 10 by means of code signals furnished from matrix circuit 2. For this purpose, the matrix circuit is specially programmed before its first use and emits the code signal corresponding to the available frequency pattern at its output $A_{17}$.

The code signal at the output $A_{17}$ is, according to FIGS. 1 and 2, the ground potential from the movable contact of channel switch 1. In another embodiment of the invention there could be more than one output $A_{17}$ so that in every position of the channel switch you can get another code signal, i.e., another frequency pattern.

If a phase deviation exists between the pulse train produced by multivibrator 12 and the output oscillation from divider 10, a comparison between the fixed reference frequency $f_R$ at the second input 24 and the divided oscillator frequency at the first input 23 of the phase comparison circuit 11 furnishes a voltage which adjusts oscillator 5 to the desired oscillator frequency. The oscillator output oscillation is available at output 26 of the PLL oscillator circuit.

The frequency predivider 6 is preferably constructed of units according to the emitter coupled logic technique, while frequency dividers 3 and 4 are preferably produced according to a metal oxide semiconductor technique. In order to match the output signal levels of the frequency predivider 6 to the prescribed input levels of frequency dividers 3 and 4, a level converter 7 is required. The circuit structure and energy intake can be designed in a particularly advantageous manner if frequency dividers 3 and 4, as well as frequency dividers 9 and 10, phase comparison circuit 11 and monostable multivibrator circuit 12 are produced as an integrated MOS module 27.

Embodiments of the dividers 9 and 10, predivider 6 and level converter 7 are, for example, the following integrated circuits:

divider 9 — COS/MOS CD 4017 AD or CD 4024 AD (RCA);
divider 10 — COS/MOS CD 4017 AD or CD 4024 AD (RCA);
predivider 6 — ECL 95 H 90 (Fairchild);
level converter 7 — MC 10 127 (Motorola).

It will be understood that the above description of the present invention is susceptible to various modifications, changes and adaptations, and the same are intended to be comprehended within the meaning and range of equivalents of the appended claims.

What is claimed is:

1. In a radio telephone unit including a channel switch for tuning the instrument to one radio channel of a certain number of given radio channels, where each radio channel has associated with it a discrete oscillator frequency, the unit further including a phase locked loop oscillator circuit containing a signal controllable frequency divider means having a plurality of control inputs and arranged to have a dividing ratio determined by the control inputs to which signals are being applied, the oscillator circuit producing oscillations at the discrete oscillator frequency of any selected channel, the improvement wherein said channel switch is constituted by a single pole switch having a plurality of fixed contacts and a movable contact disposed for connecting any one of said fixed contacts to a source of a fixed reference potential, and said unit further comprises a matrix circuit having a plurality of inputs each connected to a respective fixed contact of said switch, a plurality of outputs each connected to a respective control input of said frequency divider means, and interconnection means disposed between said inputs and outputs and permanently programmed before the first use of said unit for causing a respectively different signal pattern to appear at said outputs of said matrix circuit in response to each switching position of said channel switch.

2. An arrangement as defined in claim 1 wherein the certain number of given radio channels is assigned from a larger number of available radio channels.

3. An arrangement as defined in claim 1 wherein said matrix circuit is a diode matrix circuit.

4. An arrangement as defined in claim 1 wherein said matrix circuit is a programmable memory.

5. An arrangement as defined in claim 4 wherein said matrix circuit is a non-erasable programmable read only memory.

6. An arrangement as defined in claim 4 wherein said interconnection means can be disconnected between any one input and any one output of said matrix circuit from outside of said memory.

7. An arrangement as defined in claim 6 wherein said interconnection means comprise, between any one input and any one output of said matrix circuit, a fuse which can be melted by an electrical current.

8. An arrangement as defined in claim 3 wherein said interconnection means can be disconnected between any one input and any one output of said matrix circuit from outside of said memory.

9. An arrangement as defined in claim 1 wherein said oscillator circuit further comprises: a voltage-controlled oscillator whose output constitutes the output of said oscillator circuit, and a frequency predivider having a signal input and a signal output, and wherein said signal controllable frequency divider means comprise two frequency dividers each having a respective group of said plurality of control inputs each control input of each said divider being associated with a respectively different frequency dividing ratio, and each frequency divider having a signal input and a signal output at which appears a signal having a frequency equal to the frequency of the signal at its input divided by the respective dividing ratio, and said predivider has its signal input connected to the output of said oscillator and has its signal output connected to the signal inputs of said two frequency dividers.

10. An arrangement as defined in claim 9 wherein said frequency predivider is constituted by an emitter coupled logic circuit and said two frequency dividers are constituted by metal oxide semiconductor circuits, and said oscillator circuit further comprises a level converter connected between said signal output of said predivider and said signal inputs of said two dividers for adapting the output level of said frequency predivider to the prescribed input level of said two frequency dividers.

11. An arrangement as defined in claim 1 wherein said oscillator circuit further comprises: a fixed frequency signal generator; a voltage controlled oscillator whose output constitutes the output of said oscillator circuit; further frequency divider means having an adjustable dividing ratio and having a signal input connected to the output of said fixed frequency signal generator, and a signal output providing a reference signal whose frequency is equal to the fixed frequency divided by such dividing ratio; and a phase comparison circuit having respective inputs connected to the signal output of said further divider means and the output of said signal controllable divider means and having an output connected to supply the control voltage to said voltage controlled oscillator.

12. An arrangement as defined in claim 11 wherein said further frequency divider means are adjusted to have a dividing ratio which causes said further phase frequency divider means to emit signals at a reference frequency which depends on the frequency spacing defining the channel pattern to be received by said unit.

13. An arrangement as defined in claim 11 wherein said further frequency divider means are constructed to have their dividing ratio controlled by an electrical signal, one output of said matrix circuit is connected to supply such signal to said further frequency divider means, and said matrix means are programmed to supply the desired signal to said one output thereof.

14. An arrangement as defined in claim 11 wherein said signal controllable frequency divider means, said further frequency divider means, and said phase comparison circuit are constituted by an integrated metal oxide semiconductor circuit module.

15. An arrangement as defined in claim 11 wherein said oscillator circuit further comprises a frequency predivider and said predivider, said signal controllable frequency divider means, said further frequency divider means and said phase comparison circuit are constituted by an integrated circuit module.

* * * * *

UNITED STATES PATENT AND TRADEMARK OFFICE
CERTIFICATE OF CORRECTION

PATENT NO. : 4,070,626
DATED : January 24, 1978
INVENTOR(S) : Anton Binder et al It is certified that error appears in the above-identified patent and that said Letters Patent are hereby corrected as shown below:

Column 1, line 43, change "in" to --is--.

Correct Fig. 2 of the drawings to appear as shown below:

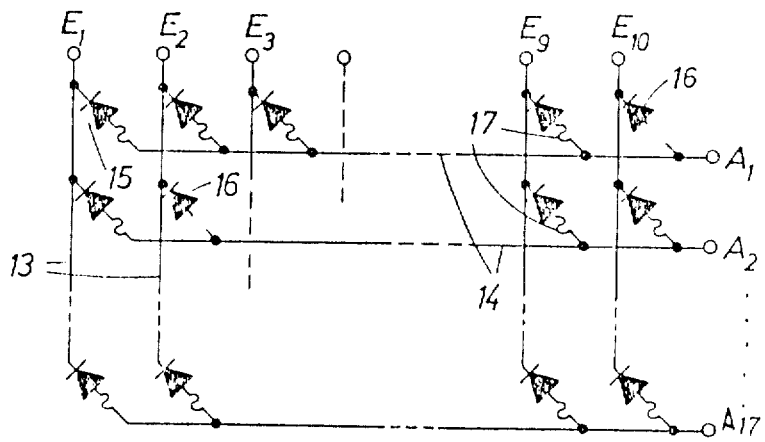

Signed and Sealed this

Twenty-seventh Day of June 1978

[SEAL]

Attest:

RUTH C. MASON
Attesting Officer

DONALD W. BANNER
Commissioner of Patents and Trademarks